(12) United States Patent
Hachigo (10) Patent No.: US 8,124,498 B2
(45) Date of Patent: Feb. 28, 2012

(54) METHOD OF MANUFACTURING GROUP III NITRIDE SEMICONDUCTOR LAYER BONDED SUBSTRATE

(75) Inventor: Akihiro Hachigo, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 17 days.

(21) Appl. No.: 12/535,201

(22) Filed: Aug. 4, 2009

(65) Prior Publication Data
US 2010/0035406 A1    Feb. 11, 2010

(30) Foreign Application Priority Data
Aug. 11, 2008  (JP) ................. 2008-206933

(51) Int. Cl.
*H01L 21/00* (2006.01)
(52) U.S. Cl. ...................... 438/459; 438/455
(58) Field of Classification Search ........... 438/455–459
See application file for complete search history.

(56) References Cited

U.S. PATENT DOCUMENTS
2008/0014714 A1    1/2008   Bourdelle et al.

FOREIGN PATENT DOCUMENTS

| EP | 1 873 817 | 1/2008 |
|----|-----------|--------|
| JP | 2000-252217 | 9/2000 |
| JP | 2006-210660 | 8/2006 |
| JP | 2008-159692 | 7/2008 |
| WO | WO 02/101125 | 12/2002 |

OTHER PUBLICATIONS

H. Shin, et al., "Growth and Decomposition of Bulk GaN: Role of the Ammonia/Nitrogen Ratio," Journal of Crystal Growth, vol. 236, No. 4, Mar. 1, 2002, pp. 529-537.

*Primary Examiner* — Richard A. Booth
(74) *Attorney, Agent, or Firm* — Drinker Biddle & Reath LLP (57) ABSTRACT

The present method of manufacturing a group III nitride semiconductor layer bonded substrate includes the steps of: implanting ions I of at least any of hydrogen and helium in a region having a prescribed depth D from one main surface of a group III nitride semiconductor substrate; bonding a different-composition substrate with the main surface of the group III nitride semiconductor substrate; obtaining a group III nitride semiconductor layer bonded substrate by separating the group III nitride semiconductor substrate at a region implanted with the ions I; and annealing the group III nitride semiconductor layer bonded substrate at a temperature not lower than 700° C. in an atmosphere of a nitrogen-containing gas N. Thus, a group III nitride semiconductor layer bonded substrate high in crystallinity of a group III nitride semiconductor layer is provided.

5 Claims, 3 Drawing Sheets

METHOD OF MANUFACTURING GROUP III NITRIDE SEMICONDUCTOR LAYER BONDED SUBSTRATE

BACKGROUND OF THE INVENTION

1. Field of the Invention

The present invention relates to a method of manufacturing a group III nitride semiconductor layer bonded substrate in which a group III nitride semiconductor layer and a different-composition substrate different in chemical composition from the group III nitride semiconductor layer are bonded with each other. The group III nitride semiconductor layer bonded substrate obtained by the manufacturing method according to the present invention is suitably used for manufacturing a semiconductor device.

2. Description of the Background Art

A group III nitride semiconductor substrate such as an $Al_{1-x}Ga_xN$ ($0 \leq x \leq 1$) substrate is suitably used for a semiconductor device, however, manufacturing cost thereof is extremely high. Accordingly, manufacturing cost of a semiconductor device including the group III nitride semiconductor substrate is extremely high, which seems to be derived from a method of manufacturing a group III nitride crystal semiconductor substrate.

Specifically, as hydride vapor phase epitaxy (HVPE), metalorganic chemical vapor deposition (MOCVD), sublimation, or other vapor phase deposition is employed to grow a crystal on the group III nitride semiconductor substrate, the crystal is grown slowly. For example, a crystal growth period of approximately 100 hours can only provide approximately 10 mm thick group III nitride semiconductor crystals. Crystals having such a thickness only allow a small number of (e.g., approximately 10) approximately 200 μm to 400 μm thick, group III nitride semiconductor substrates to be cut out therefrom.

If a group III nitride semiconductor layer to be cut out from the group III nitride semiconductor crystals is reduced in thickness to provide an increased number of group III nitride semiconductor substrates, however, mechanical strength is lowered and the substrate cannot be free-standing. Thus, there is a need for a method for reinforcing the thin group III nitride semiconductor layer cut out from the group III nitride semiconductor crystals.

An exemplary method of reinforcing a group III nitride semiconductor layer includes a method of manufacturing a substrate by bonding a group III nitride semiconductor layer with a different-composition substrate different in chemical composition from the group III nitride semiconductor layer (hereinafter, referred to as a group III nitride semiconductor layer bonded substrate). Japanese Patent Laying-Open No. 2006-210660 (Patent Document 1) discloses, as such a method of manufacturing a group III nitride semiconductor layer bonded substrate, a method of manufacturing a semiconductor substrate including the steps of implanting ions in the vicinity of a surface of a first nitride semiconductor substrate, layering the first nitride semiconductor substrate on a second substrate such that a surface side thereof faces the second substrate, subjecting the two layered substrates to heat treatment, and peeling most of the first nitride semiconductor substrate off from the second substrate such that an ion-implanted layer being defined as a boundary.

SUMMARY OF THE INVENTION

According to the method of manufacturing a semiconductor substrate disclosed in Japanese Patent Laying-Open No. 2006-210660 (Patent Document 1) above, a semiconductor substrate in which a thin nitride semiconductor layer is layered on the second substrate is obtained, however, implanted ions pass through, and are present in, the inside and a main surface of the thin nitride semiconductor layer of such a nitride semiconductor substrate and crystallinity is lowered. Therefore, crystallinity of the semiconductor layer grown on such a semiconductor substrate is lowered, which leads to lower characteristics of a semiconductor device.

An object of the present invention is to solve the above-described problems and to provide a group III nitride semiconductor layer bonded substrate high in crystallinity of a group III nitride semiconductor layer.

The present invention is directed to a method of manufacturing a group III nitride semiconductor layer bonded substrate in which a group III nitride semiconductor layer and a different-composition substrate different in chemical composition from the group III nitride semiconductor layer are bonded with each other. The present invention is directed to the method of manufacturing a group III nitride semiconductor layer bonded substrate, including the steps of: implanting ions of at least any of hydrogen and helium in a region having a prescribed depth from one main surface of a group III nitride semiconductor substrate; bonding the different-composition substrate with the main surface of the group III nitride semiconductor substrate; obtaining the group III nitride semiconductor layer bonded substrate by separating the group III nitride semiconductor substrate at the region implanted with the ions; and annealing the group III nitride semiconductor layer bonded substrate at a temperature not lower than 700° C. in an atmosphere of a nitrogen-containing gas.

In the method of manufacturing a group III nitride semiconductor layer bonded substrate according to the present invention, the nitrogen-containing gas can include an ammonia gas. In addition, the annealing step can be performed at a temperature not lower than 950° C.

In addition, the method of manufacturing a group III nitride semiconductor layer bonded substrate according to the present invention can further include the step of removing the region implanted with the ions in the group III nitride semiconductor layer after the step of obtaining the group III nitride semiconductor layer bonded substrate and before the annealing step.

Moreover, in the method of manufacturing a group III nitride semiconductor layer bonded substrate according to the present invention, a half-width of X-ray diffraction peak in a rocking curve associated with a (0002) plane of the group III nitride semiconductor layer can be 450 arcsec or lower.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a schematic cross-sectional view showing another embodiment of a method of manufacturing a group III nitride semiconductor layer bonded substrate according to the present invention; (a) showing an ion implantation step, (b)

showing a bonding step, (c) showing a step of obtaining the group III nitride semiconductor layer bonded substrate, (d) showing a step of removing an ion implanted region, and (e) showing an annealing step.

DESCRIPTION OF THE PREFERRED EMBODIMENTS

First Embodiment

Figure 1:
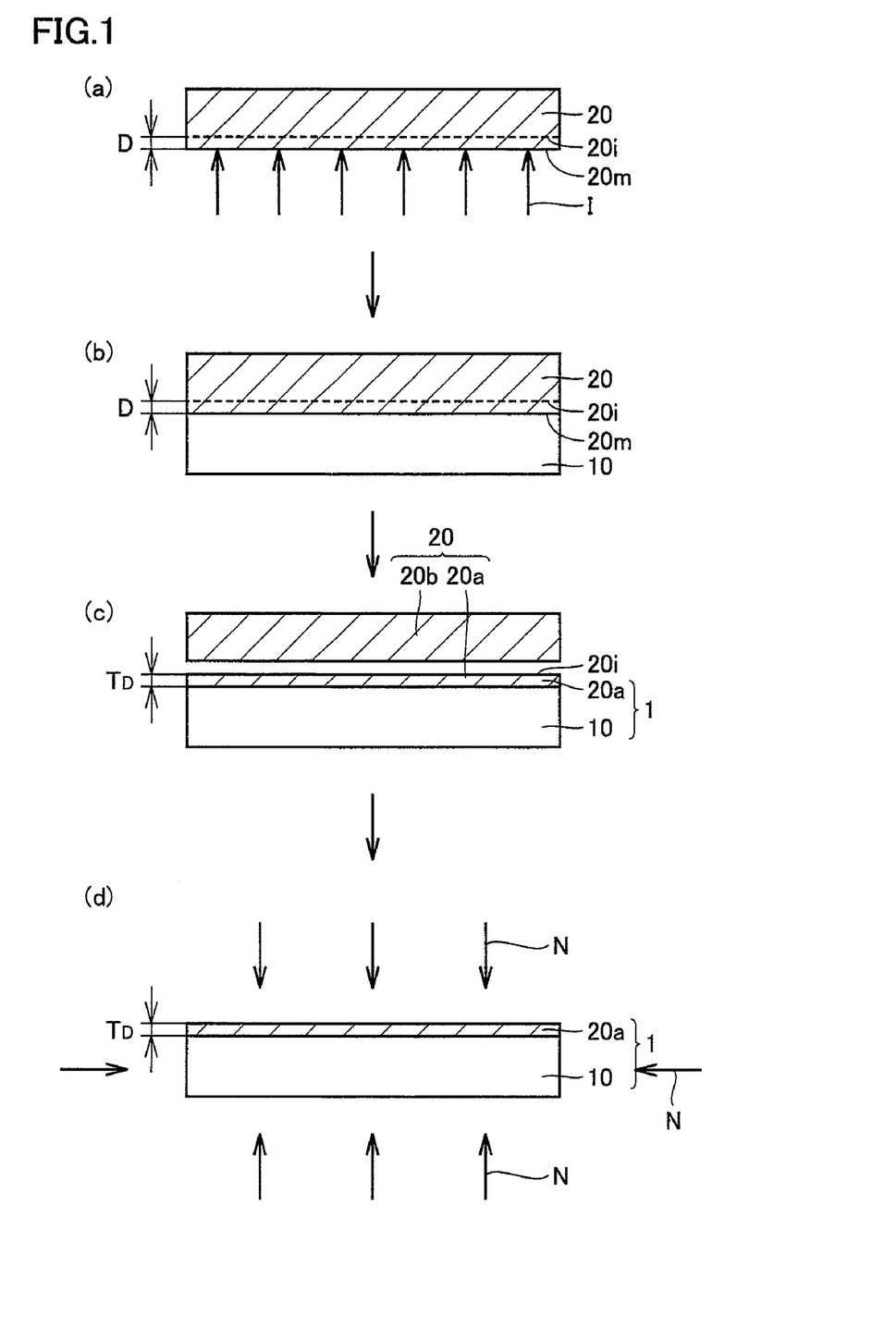
FIG. 1 is a schematic cross-sectional view showing one embodiment of a method of manufacturing a group III nitride semiconductor layer bonded substrate according to the present invention; (a) showing an ion implantation step, (b) showing a bonding step, (c) showing a step of obtaining the group III nitride semiconductor layer bonded substrate, and (d) showing an annealing step.

Referring to FIG. 1, one embodiment of a method of manufacturing a group III nitride semiconductor layer bonded substrate according to the present invention is directed to a method of manufacturing a group III nitride semiconductor layer bonded substrate 1 in which a group III nitride semiconductor layer 20a and a different-composition substrate 10 different in chemical composition from group III nitride semiconductor layer 20a are bonded with each other, including the steps of: implanting ions I of at least any of hydrogen and helium in a region having a prescribed depth D from one main surface 20m of a group III nitride semiconductor substrate 20 (FIG. 1(a)); bonding different-composition substrate 10 with main surface 20m of group III nitride semiconductor substrate 20 (FIG. 1(b)); obtaining group III nitride semiconductor layer bonded substrate 1 by separating group III nitride semiconductor substrate 20 at a region 20i implanted with ions I (FIG. 1(c)); and annealing group III nitride semiconductor layer bonded substrate 1 at a temperature not lower than 700° C. in an atmosphere of a nitrogen-containing gas N (FIG. 1(d)).

The method of manufacturing a group III nitride semiconductor layer bonded substrate according to the present embodiment is a method of manufacturing group III nitride semiconductor layer bonded substrate 1 in which group III nitride semiconductor layer 20a and different-composition substrate 10 different in chemical composition from group III nitride semiconductor layer 20a are bonded with each other.

Referring to FIG. 1(a), the method of manufacturing a group III nitride semiconductor layer bonded substrate according to the present embodiment initially includes the step of implanting ions I of at least any of hydrogen and helium in the region having prescribed depth D from one main surface 20m of group III nitride semiconductor substrate 20. Through such a step of implanting ions, ions I of at least any of hydrogen and helium are implanted in the region having depth D from one main surface 20m of group III nitride semiconductor substrate 20 to be bonded with different-composition substrate 10 and such a region (ion implanted region 20i) is embrittled.

Depth D to which ions I are implanted is not particularly limited, however, the depth is preferably not smaller than 0.05 μm and not greater than 100 μm, more preferably not smaller than 0.05 μm and not greater than 50 μm, and further preferably not smaller than 0.05 μm and not greater than 10 μm. When depth D to which ions I are implanted is smaller than 0.05 μm, crack is more likely in separating the substrate and it becomes difficult to planarize the surface. When the depth is greater than 100 μm, ions are widely distributed and it becomes difficult to control a depth of peel-off.

Region 20i where ions I are implanted refers to a region where ions in an amount equal to or greater than a dose amount contributing to separation have been implanted, and it extends to a depth±ΔD around depth D from one main surface 20m of group III nitride semiconductor substrate 20. Namely, specifically, region 20i implanted with ions I refers to a region having a depth from main surface 20m in a range from depth D−ΔD to a depth D+ΔD where ions in an amount equal to or greater than a dose amount contributing to separation are present (not shown), and the dose amount of ions is greatest in the region having depth D from main surface 20m. Here, depth ΔD varies in a range approximately from depth 0.05 D to depth 0.5 D, depending on a type of ions and a method of implanting ions.

In addition, ions of at least any of hydrogen and helium small in mass are employed as ions to be implanted, from a point of view of suppression of lowering in crystallinity of group III nitride semiconductor substrate 20. A method of implanting these ions is not particularly limited, however, it is preferred to use an ion implantation apparatus or a plasma implantation apparatus.

Referring to FIG. 1(b), the method of manufacturing a group III nitride semiconductor layer bonded substrate according to the present embodiment then includes the step of bonding different-composition substrate 10 with main surface 20m of group III nitride semiconductor substrate 20.

A method of bonding different-composition substrate 10 with main surface 20m of group III nitride semiconductor substrate 20 is not particularly limited, however, a direct joint method including the steps of washing a bonded surface, directly bonding substrates with each other, and thereafter raising a temperature to approximately 600° C. to 1200° C. for junction, a surface activation method including the steps of activating a bonding surface with plasma, ions or the like and joining the substrates with each other at a temperature from a room temperature (for example, 10° C. to 30° C.) to a low temperature of approximately 400° C., or the like is preferably employed, from a point of view of holding joint strength at a high temperature after bonding.

In addition, different-composition substrate 10 to be bonded with main surface 20m of group III nitride semiconductor substrate 20 is not particularly limited, however, it preferably has heat resistance to a temperature not lower than 1200° C. and preferably has corrosion resistance even at a temperature not lower than 1200° C., from a point of view that the different-composition substrate withstands an environment where a group III nitride semiconductor epitaxial layer is grown on group III nitride semiconductor layer 20a of manufactured group III nitride semiconductor layer bonded substrate 1. Here, corrosion resistance refers to resistance to corrosion by a corrosive crystal growth atmosphere gas such as a hydrogen chloride (HCl) gas, an ammonia ($NH_3$) gas, or the like. From such a point of view, examples of preferred different-composition substrates include a sapphire substrate, an AlN substrate, an SiC substrate, a ZnSe substrate, an Si substrate, an $SiO_2$-layer-formed Si substrate, a ZnO substrate, a ZnS substrate, a quartz substrate, a carbon substrate, a diamond substrate, a $Ga_2O_3$ substrate, and a $ZrB_2$ substrate.

Referring to FIG. 1(c), the method of manufacturing a group III nitride semiconductor layer bonded substrate according to the present embodiment then includes the step of obtaining group III nitride semiconductor layer bonded substrate 1 by separating group III nitride semiconductor substrate 20 at region 20i implanted with ions I. Through such a step, group III nitride semiconductor substrate 20 is separated into group III nitride semiconductor layer 20a bonded with different-composition substrate 10 and a remaining group III nitride semiconductor substrate 20b. Thus, group III nitride semiconductor layer bonded substrate 1 in which group III nitride semiconductor layer 20a having a thickness $T_D$ is bonded with different-composition substrate 10 is obtained.

A method of separating group III nitride semiconductor substrate 20 at region 20i implanted with ions I is not particularly limited, so long as any method of providing some kind of energy is employed. A method of applying stress to ion implanted region 20i or a method of heating ion implanted region 20i may be employed. Alternatively, a method of irradiating ion implanted region 20i with light or a method of applying ultrasound may be employed. As ion implanted region 20i is embrittled, separation is readily achieved by applying energy such as stress, heat, light, ultrasound, or the like.

Here, ion implanted region 20i extends to a depth in a range from depth D−ΔD to depth D+ΔD, from one main surface 20m of group III nitride semiconductor substrate 20, and the dose amount of ions is greatest and brittleness is highest in the region (two-dimensional region) at depth D from main surface 20m. Therefore, group III nitride semiconductor substrate 20 is normally separated at the region (two-dimensional region) at depth D from one main surface 20m of group III nitride semiconductor substrate 20 or at a region around the same. Thus, depth D where ions are implanted is substantially equal to thickness $T_D$ of the group III nitride semiconductor layer.

Referring to FIG. 1(d), the method of manufacturing a group III nitride semiconductor layer bonded substrate according to the present embodiment then includes the step of annealing group III nitride semiconductor layer bonded substrate 1 at a temperature not lower than 700° C. in an atmosphere of nitrogen-containing gas N. Crystallinity of the group III nitride layer that has lowered in the step of implanting ions above is recovered in the step of annealing at the temperature not lower than 700° C. in the atmosphere of the nitrogen-containing gas above, and the group III nitride semiconductor layer bonded substrate including the group III nitride semiconductor layer having thickness $T_D$ and high crystallinity is obtained.

The nitrogen-containing gas is not particularly limited, so long as any gas containing nitrogen is employed, and a nitrogen ($N_2$) gas, an ammonia ($NH_3$) gas, a nitrogen oxide gas, an amine compound gas, or the like is employed. In addition, the nitrogen-containing gas preferably includes the ammonia gas, from a point of view of satisfactorily maintaining morphology of the main surface of the group III nitride semiconductor layer in the annealing step above. Moreover, a pressure of the nitrogen-containing gas is not particularly limited, however, the pressure is preferably set in a range from $1 \times 10^{-4}$ atmospheric pressure (10.13 Pa) to 1 atmospheric pressure (101.3 kPa), from a point view of an annealing effect attained by the gas.

In addition, a temperature for annealing should be set to 700° C. or higher, from a point of view of recovery of crystallinity of the group III nitride semiconductor layer, and the temperature is preferably set to 850° C. or higher and further preferably to 950° C. or higher.

In particular, by performing annealing at a temperature not lower than 950° C. in the atmosphere of the nitrogen-containing gas including the ammonia gas, morphology of the main surface of the group III nitride semiconductor layer can satisfactorily be maintained and crystallinity of the group III nitride semiconductor layer can significantly be recovered.

Here, crystallinity of the group III nitride semiconductor layer can be evaluated, for example, by measuring a half-width of X-ray diffraction peak in a rocking curve associated with a (0002) plane of the group III nitride semiconductor layer. As the half-width of such X-ray diffraction peak is smaller, crystallinity is high.

As described above, the group III nitride semiconductor layer bonded substrate including the group III nitride semiconductor layer having such high crystallinity that the half-width of X-ray diffraction peak in the rocking curve associated with the (0002) plane is 450 arcsec or lower is obtained.

Second Embodiment

Figure 2:
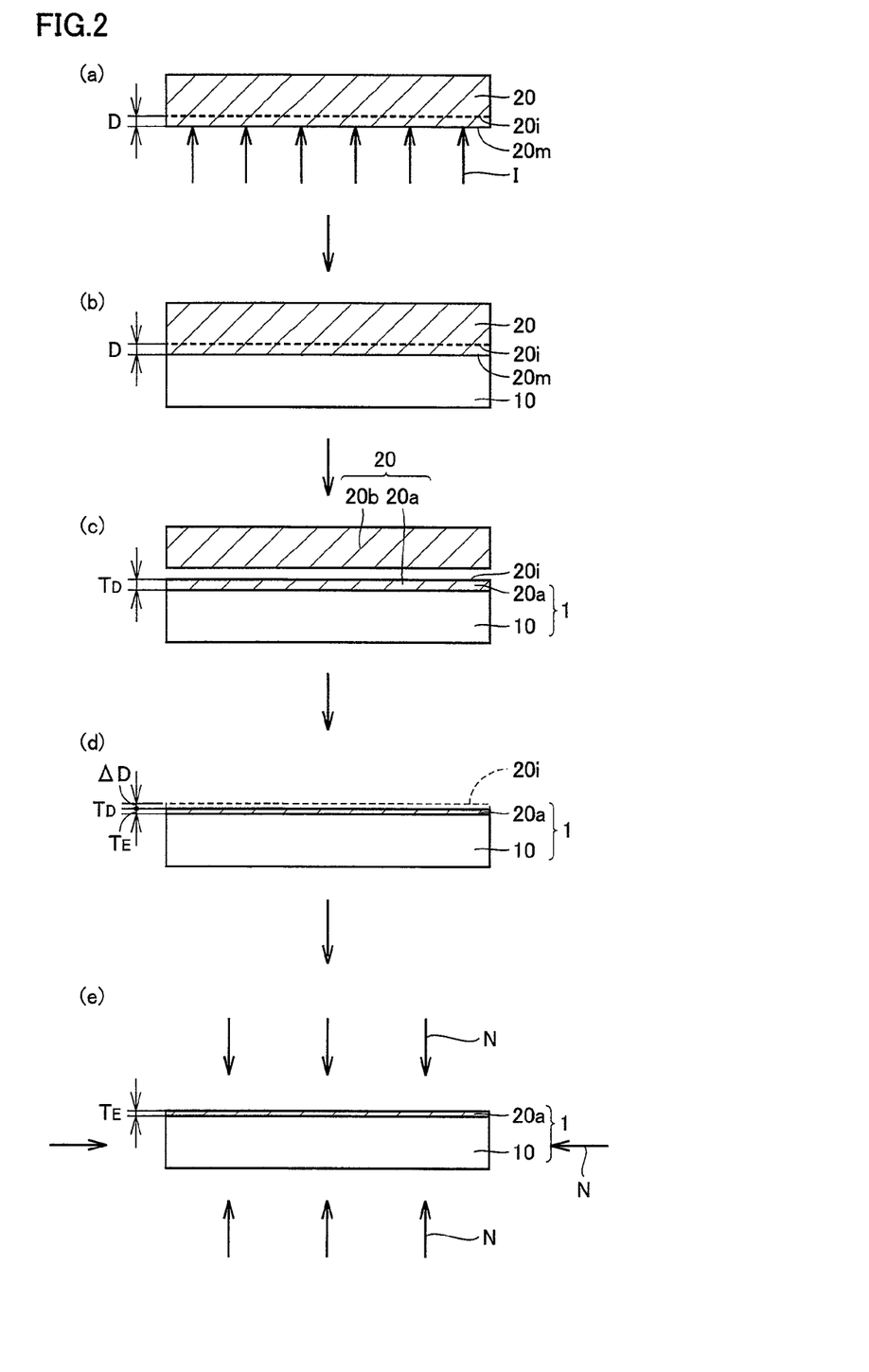

Referring to FIG. 2, another embodiment of the method of manufacturing a group III nitride semiconductor layer bonded substrate according to the present invention further includes the step of removing ion implanted region 20i (FIG. 2(d)) after the step of obtaining group III nitride semiconductor layer bonded substrate 1 (FIG. 2(c)) and before the annealing step (FIG. 2(e)) in the method of manufacturing a group III nitride semiconductor layer bonded substrate according to the first embodiment.

Specifically, the method of manufacturing a group III nitride semiconductor layer bonded substrate in the present embodiment includes the steps of: implanting ions I of at least any of hydrogen and helium in the region having prescribed depth D from one main surface 20m of group III nitride semiconductor substrate 20 (FIG. 2(a)); bonding different-composition substrate 10 with main surface 20m of group III nitride semiconductor substrate 20 (FIG. 2(b)); obtaining group III nitride semiconductor layer bonded substrate 1 by separating group III nitride semiconductor substrate 20 at region 20i implanted with ions I (FIG. 2(c)); removing region 20i implanted with ions I in group III nitride semiconductor layer 20a (FIG. 2(d)); and annealing group III nitride semiconductor layer bonded substrate 1 at a temperature not lower than 700° C. in an atmosphere of nitrogen-containing gas N (FIG. 2(e)).

Here, the step of implanting ions I in the present embodiment (FIG. 2(a)) is the same as the step of implanting ions I in the first embodiment (FIG. 1(a)), the bonding step in the present embodiment (FIG. 2(b)) is the same as the bonding step in the first embodiment (FIG. 1(b)), the step of obtaining group III nitride semiconductor layer bonded substrate 1 in the present embodiment (FIG. 2(c)) is the same as the step of obtaining group III nitride semiconductor layer bonded substrate 1 in the first embodiment (FIG. 1(c)), and the annealing step in the present embodiment (FIG. 2(e)) is the same as the annealing step in the first embodiment (FIG. 1(d)).

In the present embodiment, after region 20i (thickness ΔD) implanted with ions I in group III nitride semiconductor layer 20a (thickness $T_D$) (the region where ions I in an amount equal to or greater than the dose amount contributing to separation are present and crystallinity is significantly lowered) is removed, group III nitride semiconductor layer 20a (thickness $T_E$) is annealed, so that crystallinity of group III nitride semiconductor layer 20a can considerably be recovered. Thus, the group III nitride semiconductor layer bonded substrate including the group III nitride semiconductor layer having thickness $T_E$ and high crystallinity is obtained.

Here, a method of removing the ion implanted region in the group III nitride semiconductor layer is not particularly limited, however, a polishing method, a wet etching or dry etching method, or the like is preferred, from a point of view that the surface can be planarized and removal of the nano order can be carried out.

Example 1

1. Step of Implanting Ions in the Group III Nitride Semiconductor Substrate

Referring to FIG. 1(a), a GaN substrate having opposing main surfaces polished to be mirror surfaces, doped with oxygen, and having a diameter of 2 inches (5.08 cm) and a thickness of 500 μm was prepared as group III nitride semiconductor substrate 20. Resistivity of this GaN substrate was not higher than 1 Ω·cm and carrier density thereof was not lower than $1 \times 10^{17}$ cm$^{-3}$.

Hydrogen ions were implanted in nitrogen atom main surface (N main surface) 20m of this GaN substrate. Hydrogen ions were implanted at an acceleration voltage of 90 keV and a dose amount was set to $7 \times 10^{17}$ cm$^{-2}$. Hydrogen ion implanted region 20i was highest in the hydrogen ion dose amount in the two-dimensional region at depth D of approximately 600 nm from the N main surface.

2. Step of Bonding the Different-Composition Substrate with the Group III Nitride Semiconductor Substrate Referring to FIG. 1(b), the N main surface of group III nitride semiconductor substrate 20 implanted with hydrogen ions was washed, and thereafter plasma obtained as a result of discharge in an argon (Ar) gas in a dry etching apparatus was used to obtain a clean surface.

On the other hand, an SiO$_2$-layer-formed Si substrate having a 100 nm-thick SiO$_2$ layer formed on the surface as a result of thermal oxidation of the Si substrate was prepared as different-composition substrate 10. Plasma obtained as a result of discharge in the argon (Ar) gas in the dry etching apparatus was used to obtain a clean surface of the main surface of this SiO$_2$-layer-formed Si substrate.

Here, plasma generation conditions for cleaning the main surface of group III nitride semiconductor substrate 20 and different-composition substrate 10 above were as follows: RF power was set to 100 W; Ar gas flow rate was set to 50 sccm (a volume of a gas flow in a standard state per one minute (cm$^3$/min.)), and a pressure was set to 6.7 Pa.

The N main surface (clean surface) of the GaN substrate (group III nitride semiconductor substrate 20) and the main surface (clean surface) of the SiO$_2$-layer-formed Si substrate (different-composition substrate 10) were bonded with each other in the atmosphere.

3. Step of Obtaining the Group III Nitride Semiconductor Layer Bonded Substrate by Separating the Group III Nitride Semiconductor Substrate at the Ion Implanted Region Referring to FIG. 1(c), the GaN substrate (group III nitride semiconductor substrate 20) and the SiO$_2$-layer-formed Si substrate (different-composition substrate 10) bonded with each other were subjected to heat treatment for two hours at 300° C. in the N$_2$ gas atmosphere, so that strength of bonding between these substrates was enhanced. Then, the GaN substrate was separated at the two-dimensional region at a depth of approximately 600 nm from main surface 20m, and a GaN layer bonded substrate (group III nitride semiconductor layer bonded substrate 1) including a GaN layer (group III nitride semiconductor layer 20a) having thickness T$_D$ of approximately 600 nm was obtained.

4. Step of Annealing the Group III Nitride Semiconductor Layer Bonded Substrate Referring to FIG. 1(d), the GaN layer bonded substrate (group III nitride semiconductor layer bonded substrate 1) was annealed at 700° C. in the N$_2$ gas (nitrogen-containing gas N) atmosphere at 1 atmospheric pressure (101.3 kPa). In such an annealing step, a temperature was raised at a rate of 20° C./min., the annealing temperature was held for 30 minutes, and the temperature was lowered at a rate of 20° C./min.

Crystallinity of the GaN layer (group III nitride semiconductor layer 20a) in the GaN layer bonded substrate thus obtained was high, exhibiting a half-width of X-ray diffraction peak in the rocking curve associated with the (0002) plane of 435 arcsec.

5. Step of Growing an Epitaxial Layer

An n-type GaN epitaxial layer (epitaxial layer) of a thickness of 3 μm was grown with MOCVD on the GaN layer (the group III nitride semiconductor layer) of the GaN layer bonded substrate (the group III nitride semiconductor layer bonded substrate).

Crystallinity of the n-type GaN epitaxial layer thus obtained was high, exhibiting a half-width of X-ray diffraction peak in the rocking curve associated with the (0002) plane of 361 arcsec. Results are summarized in Table 1.

Example 2

A GaN layer bonded substrate (the group III nitride semiconductor layer bonded substrate) was manufactured and an n-type GaN epitaxial layer of a thickness of 3 μm was grown on the GaN layer of the GaN layer bonded substrate as in Example 1, except that the annealing temperature was set to 850° C. in the step of annealing the GaN layer bonded substrate.

The half-widths of X-ray diffraction peak in the rocking curve associated with the (0002) plane of the GaN layer and the n-type GaN epitaxial layer were 304 arcsec and 288 arcsec, respectively. Namely, crystallinity of the GaN layer and the n-type GaN epitaxial layer was both high. Results are summarized in Table 1.

Example 3

A GaN layer bonded substrate (the group III nitride semiconductor layer bonded substrate) was manufactured and an n-type GaN epitaxial layer of a thickness of 3 μm was grown on the GaN layer of the GaN layer bonded substrate as in Example 1, except that the annealing temperature was set to 920° C. in the step of annealing the GaN layer bonded substrate.

The half-widths of X-ray diffraction peak in the rocking curve associated with the (0002) plane of the GaN layer and the n-type GaN epitaxial layer were 265 arcsec and 201 arcsec, respectively. Namely, crystallinity of the GaN layer and the n-type GaN epitaxial layer was both high. Results are summarized in Table 1.

Comparative Example 1

A GaN layer bonded substrate (the group III nitride semiconductor layer bonded substrate) was manufactured and an n-type GaN epitaxial layer of a thickness of 3 μm was grown on the GaN layer of the GaN layer bonded substrate as in Example 1, except that the step of annealing the GaN layer bonded substrate was not performed.

The half-widths of X-ray diffraction peak in the rocking curve associated with the (0002) plane of the GaN layer and the n-type GaN epitaxial layer were 1033 arcsec and 1068 arcsec, respectively. Namely, crystallinity of the GaN layer and the n-type GaN epitaxial layer was both low. Results are summarized in Table 1.

Comparative Example 2

A GaN layer bonded substrate (the group III nitride semiconductor layer bonded substrate) was manufactured and an n-type GaN epitaxial layer of a thickness of 3 μm was grown on the GaN layer of the GaN layer bonded substrate as in Example 1, except that the annealing temperature was set to 600° C. in the step of annealing the GaN layer bonded substrate.

The half-widths of X-ray diffraction peak in the rocking curve associated with the (0002) plane of the GaN layer and the n-type GaN epitaxial layer were 624 arcsec and 630 arcsec, respectively. Namely, crystallinity of the GaN layer and the n-type GaN epitaxial layer was both low. Results are summarized in Table 1.

Example 4

A GaN layer bonded substrate (the group III nitride semiconductor layer bonded substrate) was manufactured and an n-type GaN epitaxial layer of a thickness of 3 μm was grown on the GaN layer of the GaN layer bonded substrate as in Example 1, except that a gas mixture ($N_2$ gas:$NH_3$ gas at a volume ratio of 6:4) in which the total pressure of the $N_2$ gas and the $NH_3$ gas was set to 1 atmospheric pressure (101.3 kPa) was employed as the nitrogen-containing gas in the step of annealing the GaN layer bonded substrate.

The half-widths of X-ray diffraction peak in the rocking curve associated with the (0002) plane of the GaN layer and the n-type GaN epitaxial layer were 403 arcsec and 352 arcsec, respectively. Namely, crystallinity of the GaN layer and the n-type GaN epitaxial layer was both high. Results are summarized in Table 1.

Example 5

A GaN layer bonded substrate (the group III nitride semiconductor layer bonded substrate) was manufactured and an n-type GaN epitaxial layer of a thickness of 3 μm was grown on the GaN layer of the GaN layer bonded substrate as in Example 1, except that a gas mixture ($N_2$ gas:$NH_3$ gas at a volume ratio of 6:4) in which the total pressure of the $N_2$ gas and the $NH_3$ gas was set to 1 atmospheric pressure (101.3 kPa) was employed as the nitrogen-containing gas and the annealing temperature was set to 850° C. in the step of annealing the GaN layer bonded substrate.

The half-widths of X-ray diffraction peak in the rocking curve associated with the (0002) plane of the GaN layer and the n-type GaN epitaxial layer were 297 arcsec and 282 arcsec, respectively. Namely, crystallinity of the GaN layer and the n-type GaN epitaxial layer was both high. Results are summarized in Table 1.

Referring to Table 1, it was found that crystallinity of the GaN layer of the GaN layer bonded substrate was low and the n-type GaN epitaxial layer low in crystallinity grew further on such a GaN layer when the annealing step was not performed (Comparative Example 1) and when the annealing temperature was low at 600° C. in spite of the annealing step being performed (Comparative Example 2). On the other hand, it was found that crystallinity of the GaN layer of the GaN layer bonded substrate was high and the n-type GaN epitaxial layer high in crystallinity grew further on such a GaN layer when the annealing step was performed at an annealing temperature not lower than 700° C. (Examples 1 to 3).

In addition, it was found that crystallinity of the GaN layer of the GaN layer bonded substrate was high and the n-type GaN epitaxial layer high in crystallinity grew further on such a GaN layer also when the gas mixture of the $N_2$ gas and the $NH_3$ gas was employed (Examples 4 and 5) instead of the $N_2$ gas (Examples 1 and 2) as the nitrogen-containing gas at an annealing temperature not lower than 700° C. in the annealing step. Moreover, it was found that, when the gas mixture of the $N_2$ gas and the $NH_3$ gas was employed as the nitrogen-containing gas (Examples 4 and 5), crystallinity of the GaN layer of the GaN layer bonded substrate and the n-type GaN epitaxial layer grown on that GaN layer was higher than in the examples employing the $N_2$ gas as the nitrogen-containing gas (Examples 1 and 2).

Example 6

A GaN layer bonded substrate (the group III nitride semiconductor layer bonded substrate) was manufactured as in Example 1, except that the annealing temperature was set to 950° C. in the step of annealing the GaN layer bonded substrate. When the main surface of the GaN layer of the GaN layer bonded substrate was observed with an SEM (Scanning Electron Microscope), droplets of Ga atoms due to loss of N atoms were found in the main surface of the GaN layer. Results are summarized in Table 2.

Example 7

A GaN layer bonded substrate (the group III nitride semiconductor layer bonded substrate) was manufactured as in Example 6, except that a gas mixture ($N_2$ gas:$NH_3$ gas at a volume ratio of 8:2) in which the total pressure of the $N_2$ gas and the $NH_3$ gas was set to 1 atmospheric pressure (101.3 kPa) was employed as the nitrogen-containing gas in the step of annealing the GaN layer bonded substrate. Morphology of the main surface of the GaN layer of the GaN layer bonded substrate was good. Results are summarized in Table 2.

TABLE 1

| | | Comparative Example 1 | Comparative Example 2 | Example 1 | Example 2 | Example 3 | Example 4 | Example 5 |
|---|---|---|---|---|---|---|---|---|
| Different-Composition Substrate | | $SiO_2$/Si | $SiO_2$/Si | $SiO_2$/Si | $SiO_2$/Si | $SiO_2$/Si | $SiO_2$/Si | $SiO_2$/Si |
| Group III Nitride Semiconductor Substrate | | GaN | GaN | GaN | GaN | GaN | GaN | GaN |
| Type of Implanted Ions | | H ion | H ion | H ion | H ion | H ion | H ion | H ion |
| Thickness of Ion Implanted Region to Be Removed (nm) | | — | — | — | — | — | — | — |
| Annealing Step | Nitrogen-Containing Gas (Volume Ratio) | — | $N_2$ | $N_2$ | $N_2$ | $N_2$ | $N_2$:$NH_3$ (6:4) | $N_2$:$NH_3$ (6:4) |
| | Annealing Temperature (° C.) | — | 600 | 700 | 850 | 920 | 700 | 850 |
| Half-Width of X-Ray Diffraction Peak (arcsec) | Group III Nitride Semiconductor Layer | 1033 | 624 | 435 | 304 | 265 | 403 | 297 |
| | Epitaxial Layer | 1068 | 630 | 361 | 288 | 201 | 352 | 282 |
| Notes | | | | | | | | |

Example 8

A GaN layer bonded substrate (the group III nitride semiconductor layer bonded substrate) was manufactured as in Example 6, except that a gas mixture (N₂ gas:NH₃ gas at a volume ratio of 6:4) in which the total pressure of the N₂ gas and the NH₃ gas was set to 1 atmospheric pressure (101.3 kPa) was employed as the nitrogen-containing gas in the step of annealing the GaN layer bonded substrate. Morphology of the main surface of the GaN layer of the GaN layer bonded substrate was good. Results are summarized in Table 2.

Example 9

A GaN layer bonded substrate (the group III nitride semiconductor layer bonded substrate) was manufactured as in Example 6, except that a gas mixture (N₂ gas:NH₃ gas at a volume ratio of 4:6) in which the total pressure of the N₂ gas and the NH₃ gas was set to 1 atmospheric pressure (101.3 kPa) was employed as the nitrogen-containing gas in the step of annealing the GaN layer bonded substrate. Morphology of the main surface of the GaN layer of the GaN layer bonded substrate was good. Results are summarized in Table 2.

Example 10

A GaN layer bonded substrate (the group III nitride semiconductor layer bonded substrate) was manufactured as in Example 6, except that a gas mixture (N₂ gas:NH₃ gas at a volume ratio of 2:8) in which the total pressure of the N₂ gas and the NH₃ gas was set to 1 atmospheric pressure (101.3 kPa) was employed as the nitrogen-containing gas in the step of annealing the GaN layer bonded substrate. Morphology of the main surface of the GaN layer of the GaN layer bonded substrate was good. Results are summarized in Table 2.

Example 11

A GaN layer bonded substrate (the group III nitride semiconductor layer bonded substrate) was manufactured as in Example 6, except that the NH₃ gas at 1 atmospheric pressure (101.3 kPa) was employed as the nitrogen-containing gas in the step of annealing the GaN layer bonded substrate. Morphology of the main surface of the GaN layer of the GaN layer bonded substrate was good. Results are summarized in Table 2.

Similar results were obtained also with regard to the GaN layer bonded substrates manufactured as in Examples 6 to 11 with the annealing temperature being varied from 950° C. to 1000° C.

It was found from Table 2 and the finding above that morphology of the main surface of the GaN layer was satisfactorily held by containing the NH₃ gas as the nitrogen-containing gas in annealing the GaN layer bonded substrate (the group III nitride semiconductor layer bonded substrate) at a temperature not lower than 950° C.

Example 12

1. Step of Implanting Ions in the Group III Nitride Semiconductor Substrate

A GaN substrate as in Example 1 was prepared. An AlGaN layer having a thickness of 2 μm and a chemical composition ratio of Al of 0.2 was grown on this GaN substrate with MOCVD. Hydrogen (H) ions were implanted in the main surface of the AlGaN layer of the GaN substrate (the group III nitride semiconductor substrate) on which the AlGaN layer was grown. Hydrogen ions were implanted at an acceleration voltage of 100 keV and a dose amount was set to $6 \times 10^{17}$ cm$^{-2}$. Hydrogen ion implanted region 20i was highest in the hydrogen ion dose amount in the two-dimensional region at a depth of approximately 630 nm from the main surface.

2. Step of Bonding the Different-Composition Substrate with the Group III Nitride Semiconductor Substrate The main surface of the AlGaN layer of the group III nitride semiconductor substrate implanted with hydrogen ions was washed, and thereafter plasma obtained as a result of discharge in the argon (Ar) gas in the dry etching apparatus was used to obtain a clean surface.

On the other hand, an SiO₂-layer-formed Si substrate having a 100 nm-thick SiO₂ layer formed on the surface as a result of thermal oxidation of the Si substrate was prepared as the different-composition substrate. Plasma obtained as a result of discharge in the argon (Ar) gas in the dry etching apparatus was used to obtain a clean surface of the main surface of this SiO₂-layer-formed Si substrate.

Here, plasma generation conditions for cleaning the main surface of the group III nitride semiconductor substrate and the different-composition substrate above were the same as in Example 1.

The main surface (clean surface) of the AlGaN layer of the GaN substrate (the group III nitride semiconductor substrate) on which the AlGaN layer was grown and the main surface

TABLE 2

| | | Example 6 | Example 7 | Example 8 | Example 9 | Example 10 | Example 11 |
|---|---|---|---|---|---|---|---|
| Different-Composition Substrate | | SiO₂/Si | SiO₂/Si | SiO₂/Si | SiO₂/Si | SiO₂/Si | SiO₂/Si |
| Group III Nitride Semiconductor Substrate | | GaN | GaN | GaN | GaN | GaN | GaN |
| Type of Implanted Ions | | H ion | H ion | H ion | H ion | H ion | H ion |
| Thickness of Ion Implanted Region to Be Removed (nm) | | — | — | — | — | — | — |
| Annealing Step | Nitrogen-Containing Gas (Volume Ratio) | N₂ | N₂:NH₃ (8:2) | N₂:NH₃ (6:4) | N₂:NH₃ (4:6) | N₂:NH₃ (2:8) | NH₃ |
| | Annealing Temperature (° C.) | 950 | 950 | 950 | 950 | 950 | 950 |
| Half-Width of X-Ray Diffraction Peak (arcsec) | Group III Nitride Semiconductor Layer Epitaxial Layer | — | — | — | — | — | — |
| Notes | | Droplets of Ga in Main Surface | Good Main Surface Morphology | Good Main Surface Morphology | Good Main Surface Morphology | Good Main Surface Morphology | Good Main Surface Morphology |

(clean surface) of the SiO$_2$-layer-formed Si substrate (the different-composition substrate) were bonded with each other in the atmosphere.

3. Step of Obtaining the Group III Nitride Semiconductor Layer Bonded Substrate by Separating the Group III Nitride Semiconductor Substrate at the Ion Implanted Region The GaN substrate (the group III nitride semiconductor substrate) on which the AlGaN layer was grown and the SiO$_2$-layer-formed Si substrate (the different-composition substrate) bonded with each other were subjected to heat treatment for two hours at 400° C. in the N$_2$ gas atmosphere, so that strength of bonding between these substrates was enhanced. Then, the AlGaN layer grown on the GaN substrate was separated at the two-dimensional region at a depth of approximately 600 nm from main surface 20$m$ and an AlGaN layer bonded substrate (group III nitride semiconductor layer bonded substrate 1) including the AlGaN layer (the group III nitride semiconductor layer) having a thickness of approximately 600 nm was obtained.

4. Step of Annealing the Group III Nitride Semiconductor Layer Bonded Substrate

The AlGaN layer bonded substrate (the group III nitride semiconductor layer bonded substrate) was annealed at 800° C. in the N$_2$ gas (nitrogen-containing gas N) atmosphere at 1 atmospheric pressure (101.3 kPa). In such an annealing step, a temperature was raised at a rate of 20° C./min., the annealing temperature was held for 30 minutes, and the temperature was lowered at a rate of 20° C./min.

Crystallinity of the AlGaN layer (the group III nitride semiconductor layer) in the AlGaN layer bonded substrate thus obtained was high, exhibiting a half-width of X-ray diffraction peak in the rocking curve associated with the (0002) plane of 477 arcsec. Results are summarized in Table 3.

Comparative Example 3

An AlGaN layer bonded substrate was manufactured as in Example 12, except that the step of annealing the AlGaN layer bonded substrate (the group III nitride semiconductor layer bonded substrate) was not performed. Crystallinity of the AlGaN layer (the group III nitride semiconductor layer) of the obtained AlGaN layer bonded substrate was low, exhibiting a half-width of X-ray diffraction peak in the rocking curve associated with the (0002) plane of 943 arcsec. Results are summarized in Table 3.

Example 13

1. Step of Implanting Ions in the Group III Nitride Semiconductor Substrate

A GaN substrate (the group III nitride semiconductor substrate) as in Example 1 was prepared. Helium (He) ions were implanted in nitrogen atom main surface (N main surface) 20$m$ of this GaN substrate. Helium ions were implanted at an acceleration voltage of 80 keV and a dose amount was set to $4 \times 10^{17}$ cm$^{-2}$. Helium ion implanted region 20$i$ was highest in the helium ion dose amount in the two-dimensional region at a depth of approximately 370 nm from the N main surface.

2. Step of Bonding the Different-Composition Substrate with the Group III Nitride Semiconductor Substrate The N main surface of the group III nitride semiconductor substrate implanted with helium ions was washed, and thereafter plasma obtained as a result of discharge in the argon (Ar) gas in the dry etching apparatus was used to obtain a clean surface.

On the other hand, an SiO$_2$-layer-formed Si substrate having a 100 nm-thick SiO$_2$ layer formed on the surface as a result of thermal oxidation of the Si substrate was prepared as the different-composition substrate. Plasma obtained as a result of discharge in the argon (Ar) gas in the dry etching apparatus was used to obtain a clean surface of the main surface of this SiO$_2$-layer-formed Si substrate.

Here, plasma generation conditions for cleaning the main surface of the group III nitride semiconductor substrate and the different-composition substrate above were the same as in Example 1.

The N main surface (clean surface) of the GaN substrate (the group III nitride semiconductor substrate) and the main surface (clean surface) of the SiO$_2$-layer-formed Si substrate (the different-composition substrate) were bonded with each other in the atmosphere.

3. Step of Obtaining the Group III Nitride Semiconductor Layer Bonded Substrate by Separating the Group III Nitride Semiconductor Substrate at the Ion Implanted Region The GaN substrate (the group III nitride semiconductor substrate) and the SiO$_2$-layer-formed Si substrate (the different-composition substrate) bonded with each other were subjected to heat treatment for two hours at 500° C. in the N$_2$ gas atmosphere, so that strength of bonding between these substrates was enhanced. Then, the GaN substrate was separated at the two-dimensional region at a depth of approximately 410 nm from the main surface and the GaN layer bonded substrate (the group III nitride semiconductor layer bonded substrate) including the GaN layer (the group III nitride semiconductor layer) having a thickness of approximately 410 nm was obtained.

4. Step of Annealing the Group III Nitride Semiconductor Layer Bonded Substrate

The GaN layer bonded substrate (the group III nitride semiconductor layer bonded substrate) was annealed at 920° C. in the N$_2$ gas (nitrogen-containing gas N) atmosphere at 1 atmospheric pressure (101.3 kPa). In such an annealing step, a temperature was raised at a rate of 20° C./min., the annealing temperature was held for 30 minutes, and the temperature was lowered at a rate of 20° C./min.

Crystallinity of the GaN layer (the group III nitride semiconductor layer) in the GaN layer bonded substrate thus obtained was high, exhibiting a half-width of X-ray diffraction peak in the rocking curve associated with the (0002) plane of 372 arcsec. Results are summarized in Table 3.

Comparative Example 4

A GaN layer bonded substrate was manufactured as in Example 13, except that the step of annealing the GaN layer bonded substrate (the group III nitride semiconductor layer bonded substrate) was not performed. Crystallinity of the GaN layer (the group III nitride semiconductor layer) of the obtained GaN layer bonded substrate was low, exhibiting a half-width of X-ray diffraction peak in the rocking curve associated with the (0002) plane of 1094 arcsec. Results are summarized in Table 3.

Example 14

A GaN layer bonded substrate (the group III nitride semiconductor layer bonded substrate) was manufactured and an n-type GaN epitaxial layer of a thickness of 3 μm was grown on the GaN layer of the GaN layer bonded substrate as in Example 1, except that the step of removing hydrogen ion implanted region 20$i$ in the GaN layer (FIG. 2($d$)) was performed after the step of obtaining the GaN layer bonded substrate by separating the GaN substrate (the group III nitride semiconductor substrate) and before the step of annealing the GaN layer bonded substrate and that the annealing temperature in the annealing step was set to 920° C. Here, the hydrogen ion implanted region was removed with CMP (Chemical Mechanical Polishing), to a depth of 100 nm from the surface of the GaN layer after it was separated.

The half-widths of X-ray diffraction peak in the rocking curve associated with the (0002) plane of the GaN layer and the n-type GaN epitaxial layer were 221 arcsec and 163 arcsec, respectively. Namely, crystallinity of the GaN layer and the n-type GaN epitaxial layer was both extremely high. Results are summarized in Table 3.

TABLE 3

| | | Comparative Example 3 | Example 12 | Comparative Example 4 | Example 13 | Example 14 |
|---|---|---|---|---|---|---|
| Different-Composition Substrate | | $SiO_2/Si$ | $SiO_2/Si$ | $SiO_2/Si$ | $SiO_2/Si$ | $SiO_2/Si$ |
| Group III Nitride Semiconductor Substrate | | AlGaN/GaN | AlGaN/GaN | GaN | GaN | GaN |
| Type of Implanted Ions | | H ion | H ion | He ion | He ion | H ion |
| Thickness of Ion Implanted Region to Be Removed (nm) | | — | — | — | — | 100 |
| Annealing Step | Nitrogen-Containing Gas (Volume Ratio) | — | $N_2$ | — | $N_2$ | $N_2$ |
| | Annealing Temperature (° C.) | — | 800 | — | 920 | 920 |
| Half-Width of X-Ray Diffraction Peak (arcsec) | Group III Nitride Semiconductor Layer | 943 | 477 | 1094 | 372 | 221 |
| | Epitaxial Layer | — | — | — | — | 163 |
| Notes | | | | | | |

Referring to Table 3, it was found that the AlGaN layer bonded substrate including the AlGaN layer having high crystallinity was obtained as a result of recovery of crystallinity of the AlGaN layer achieved by annealing of the AlGaN layer bonded substrate at a temperature not lower than 700° C. also in manufacturing the AlGaN layer bonded substrate (Example 12 and Comparative Example 3). In addition, it was found that the GaN layer bonded substrate including the GaN layer having high crystallinity was obtained as a result of recovery of crystallinity of the GaN layer achieved by annealing of the GaN layer bonded substrate at a temperature not lower than 700° C. also when helium ions were used as implanted ions in manufacturing the GaN layer bonded substrate (Example 13 and Comparative Example 4). Moreover, it was found that crystallinity of the GaN layer of the GaN layer bonded substrate and the n-type GaN epitaxial layer grown on the GaN layer was extremely high by performing the step of removing ion implanted region 20*i* in the GaN layer after the step of obtaining the GaN layer bonded substrate by separating the GaN substrate and before the step of annealing the GaN layer bonded substrate in manufacturing the GaN layer bonded substrate (Example 14).

(Evaluation of Characteristics Based on Semiconductor Devices)

1. Fabrication of Semiconductor Device

Figure 3:
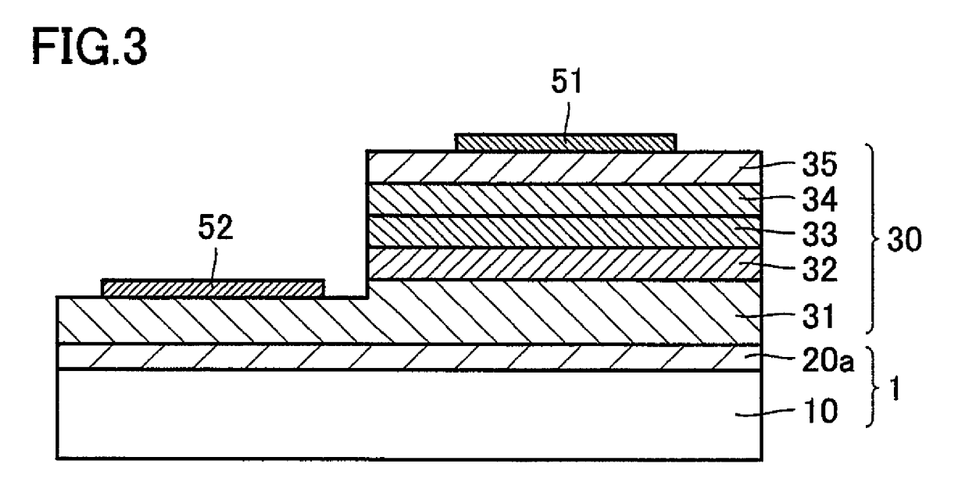
FIG. 3 is a schematic cross-sectional view showing an example of a semiconductor device including the group III nitride semiconductor layer bonded substrate according to the present invention.

Referring to FIG. 3, a semiconductor device (LED) was fabricated in the following manner, by using each GaN layer bonded substrate (group III nitride semiconductor layer bonded substrate 1) manufactured in each of Comparative Example 1 and Examples 1 and 3.

Specifically, on the GaN layer (group III nitride semiconductor layer 20*a*) of the GaN layer bonded substrate (group III nitride semiconductor layer bonded substrate 1) above, an n-type GaN layer 31 having a thickness of 5 μm, an n-type $Al_{0.05}Ga_{0.95}N$ layer 32 having a thickness of 0.5 μm, a light-emitting layer 33 having an MQW (multi quantum well) structure consisting of six pairs of an $In_{0.15}Ga_{0.85}N$ layer and an $In_{0.01}Ga_{0.99}N$ layer and a thickness of 100 nm, a p-type $Al_{0.20}Ga_{0.80}N$ layer 34 having a thickness of 20 nm, and a p-type GaN layer 35 having a thickness of 0.15 μm were successively grown as a GaN-based semiconductor layer 30, with MOCVD. Thereafter, a surface of n-type GaN layer 31 was partially exposed by mesa etching. Thereafter, with vacuum evaporation or electron beam evaporation, a p-side electrode 51 was formed on p-type GaN layer 35 and an n-side electrode 52 was formed on n-type GaN layer 31 of which surface was exposed.

Here, a semiconductor device including the GaN layer bonded substrate in Comparative Example 1 is referred to as a semiconductor device according to Comparative Example 1, a semiconductor device including the GaN layer bonded substrate in Example 1 is referred to as a semiconductor device according to Example 1, and a semiconductor device including the GaN layer bonded substrate in Example 3 is referred to as a semiconductor device according to Example 3.

2. Evaluation of Characteristics of Semiconductor Devices

For each of the semiconductor devices according to Comparative Example 1 and Examples 1 and 3 above, light emission intensity of light emission spectrum at a peak wavelength of 450 nm and at an injection current of 80 mA was measured with EL (electroluminescence). Light emission intensity of the semiconductor device according to Example 1 relative to that of Comparative Example 1 was 1.5, and light emission intensity of the semiconductor device according to Example 3 relative to that of Comparative Example 1 was 2.6. Thus, it could be confirmed that a semiconductor device having high characteristics is obtained by employing the GaN layer bonded substrate including the GaN layer having high crystallinity.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a group III nitride semiconductor layer bonded substrate in which a group III nitride semiconductor layer and a different-composition substrate different in chemical composition from said group III nitride semiconductor layer are bonded with each other, comprising the steps of:

implanting ions of at least any of hydrogen and helium in a region having a prescribed depth from one main surface of a group III nitride semiconductor substrate;

bonding said different-composition substrate with said main surface of said group III nitride semiconductor substrate;

obtaining said group III nitride semiconductor layer bonded substrate by separating said group III nitride semiconductor substrate at said region implanted with said ions; and annealing said group III nitride semiconductor layer bonded substrate at a temperature not lower than 700° C. in an atmosphere of a nitrogen-containing gas to recover crystallinity of said group III nitride semiconductor layer that has been lowered in the step of implanting ions.

2. The method of manufacturing a group III nitride semiconductor layer bonded substrate according to claim 1, wherein said nitrogen-containing gas includes an ammonia gas.

3. The method of manufacturing a group III nitride semiconductor layer bonded substrate according to claim 1, wherein said annealing step is performed at a temperature not lower than 950° C.

4. The method of manufacturing a group III nitride semiconductor layer bonded substrate according to claim 1, further comprising the step of removing said region implanted with said ions in said group III nitride semiconductor layer after said step of obtaining said group III nitride semiconductor layer bonded substrate and before said annealing step.

5. The method of manufacturing a group III nitride semiconductor layer bonded substrate according to claim 1, wherein a half-width of X-ray diffraction peak in a rocking curve associated with a (0002) plane of said group III nitride semiconductor layer is 450 arcsec or lower.

* * * * *